United States Patent
Hasegawa et al.

(10) Patent No.: US 10,148,256 B2
(45) Date of Patent: Dec. 4, 2018

(54) SIGNAL GENERATING CIRCUIT, VOLTAGE CONVERSION DEVICE, AND SIGNAL GENERATING METHOD

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Takeshi Hasegawa, Mie (JP); Seiji Takahashi, Mie (JP); Takenori Abe, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/552,603

(22) PCT Filed: Feb. 29, 2016

(86) PCT No.: PCT/JP2016/056043
§ 371 (c)(1),
(2) Date: Aug. 22, 2017

(87) PCT Pub. No.: WO2016/137005
PCT Pub. Date: Sep. 1, 2016

(65) Prior Publication Data
US 2018/0034449 A1    Feb. 1, 2018

(30) Foreign Application Priority Data
Feb. 27, 2015    (JP) .................................. 2015-038913

(51) Int. Cl.
H02M 1/08        (2006.01)
H03K 3/017       (2006.01)
(Continued)

(52) U.S. Cl.
CPC .............. H03K 3/017 (2013.01); H02M 1/08 (2013.01); H02M 1/088 (2013.01); H02M 3/157 (2013.01);
(Continued)

(58) Field of Classification Search
CPC ....................................................... H02M 1/08
See application file for complete search history.

(56) References Cited

U.S. PATENT DOCUMENTS

| | | | |
|---|---|---|---|
| 7,315,158 B1 | 1/2008 | Matsui | |
| 2007/0296387 A1* | 12/2007 | Dong | H02M 3/157 323/285 |
| 2012/0161741 A1* | 6/2012 | Zambetti | G05F 3/245 323/294 |

FOREIGN PATENT DOCUMENTS

| JP | H03-098470 A | 4/1991 |
|---|---|---|
| JP | 2007-266763 A | 10/2007 |
| JP | 2011-205810 A | 10/2011 |

OTHER PUBLICATIONS

Search Report for PCT/JP2016/056043, dated May 17, 2016.

* cited by examiner

Primary Examiner — Jue Zhang
Assistant Examiner — Trinh Q Dang
(74) Attorney, Agent, or Firm — Honigman Miller Schwartz and Cohn LLP

(57) ABSTRACT

Provided are a signal generating circuit, a voltage conversion device, and a signal generating method configured to make a minimum unit of values that are respectively set in m (where m is a natural number equal to or greater than 2)

(Continued)

generating units that periodically generate PWM signals corresponding to the setting values substantially smaller than an actual minimum unit. A CPU specifies, at every n periods of the PWM signals generated by the m generating units SG1, SG2, . . . SGm, a settable value closest to the sum of target values for n periods, determines (m×n) setting values for n periods based on a quotient and a remainder obtained by dividing the specified settable value by the product of m and n, and sets the determined values in the respective generating units SG1, SG2, . . . SGm, using phase-specific interrupt processes that are different from each other.

9 Claims, 10 Drawing Sheets

(51) Int. Cl.
*H02M 3/157* (2006.01)
*H02M 1/088* (2006.01)
*H02M 3/158* (2006.01)
*H03K 5/19* (2006.01)
*H03K 17/687* (2006.01)

(52) U.S. Cl.
CPC .............. *H02M 3/158* (2013.01); *H03K 5/19* (2013.01); *H03K 17/687* (2013.01); *H02M 2003/1586* (2013.01)

FIG. 7

| Target value | First Period | | | Second Period | | | Third Period | | | Average of sum of setting values for each period |
|---|---|---|---|---|---|---|---|---|---|---|
| | First phase | Second phase | Third phase | First phase | Second phase | Third phase | First phase | Second phase | Third phase | |
| ... | ... | ... | ... | ... | ... | ... | ... | ... | ... | ... |
| 29.83~30.17 | 10 | 10 | 10 | 10 | 10 | 10 | 10 | 10 | 10 | 30.00 |
| 30.17~30.50 | 11 | 10 | 10 | 10 | 10 | 10 | 10 | 10 | 10 | 30.33 |
| 30.50~30.83 | 11 | 11 | 10 | 10 | 10 | 10 | 10 | 10 | 10 | 30.67 |
| ... | ... | ... | ... | ... | ... | ... | ... | ... | ... | ... |
| 59.83~60.17 | 20 | 20 | 20 | 20 | 20 | 20 | 20 | 20 | 20 | 60.00 |
| 60.17~60.50 | 21 | 20 | 20 | 20 | 20 | 20 | 20 | 20 | 20 | 60.33 |
| ... | ... | ... | ... | ... | ... | ... | ... | ... | ... | ... |
| 66.83~67.17 | 23 | 23 | 23 | 22 | 22 | 22 | 22 | 22 | 22 | 67.00 |
| 67.17~67.50 | 23 | 23 | 23 | 23 | 23 | 22 | 22 | 22 | 22 | 67.33 |
| 67.50~67.83 | 23 | 23 | 23 | 23 | 23 | 22 | 22 | 22 | 22 | 67.67 |
| 67.83~68.17 | 23 | 23 | 23 | 23 | 23 | 23 | 22 | 22 | 22 | 68.00 |
| 68.17~68.50 | 23 | 23 | 23 | 23 | 23 | 23 | 23 | 22 | 22 | 68.33 |
| ... | ... | ... | ... | ... | ... | ... | ... | ... | ... | ... |

(m × n) setting values for n periods

SIGNAL GENERATING CIRCUIT, VOLTAGE CONVERSION DEVICE, AND SIGNAL GENERATING METHOD

CROSS-REFERENCE TO RELATED APPLICATIONS

This application is the U.S. national stage of PCT/JP2016/056043 filed Feb. 29, 2016, which claims priority of Japanese Patent Application No. JP 2015-038913 filed Feb. 27, 2015.

TECHNICAL FIELD

The present invention relates to a signal generating circuit, a voltage conversion device, and a signal generating method in which m (where m is a natural number equal to or greater than 2) generating units that generate PWM signals corresponding to setting values, and a control unit that sets values that are settable in the respective generating units based on a target value are provided.

BACKGROUND

Conventionally, voltage conversion devices that drive switching elements with a PWM signal to convert a voltage are widely used. In such voltage conversion devices of a PWM control type, for example, a voltage command value is calculated based on a target voltage value, values that correspond to the calculated voltage command value are set in PWM signal generating units, and thereby PWM signals having duty cycles that correspond to the setting values are generated. By changing the duty cycles of the PWM signals that drive the switching elements based on the target voltage value in this way, an output voltage that corresponds to the target voltage value can be obtained.

Here, if the values that are settable in the PWM signal generating units (hereinafter, referred to as "settable values") have a relatively large minimum unit (that is, minimum increment), the duty cycles of the PWM signals cannot smoothly be changed in response to a change in the target value, and the output voltage will change stepwise. Furthermore, for example, if target values that are to be set in the PWM signal generating units are calculated as operation amounts in PWM control, and a minimum unit of the settable values is larger than a minimum unit of the target values, the duty cycles of the PWM signals cannot smoothly be changed in response to a change in the target voltage value and a load change, and an error will occur in the output voltage.

To solve this, JP-H03-98470A discloses a PWM inverter that calculates an on/off time of a PWM signal in each period of PWM control using the division such that a voltage command value is used as a dividend and a remainder is truncated, and outputs a PWM pulse based on the calculation result. The remainder obtained in the above-described calculation corresponds to a voltage command value that is truncated without being reflected in the on/off time.

In this PWM inverter, the truncated remainders are sequentially added to voltage command values in the calculation in the next period onwards, such that a remainder that was not reflected in an on/off time in the previous calculation is reflected in a new on/off time in the next calculation, and a remainder that is obtained in this calculation is reflected in the calculation after the next calculation, and such processes are repeated. Accordingly, it is possible to bring an average on/off time that is to be set in the PWM signal generating units close to a target on/off time that is set ideally. In other words, it is possible to make a minimum unit of values that are to be set in generating units on average smaller than an actual minimum unit.

However, in the technique disclosed in JP-H03-98470A, calculation including division is executed in each period of PWM control to determine an on/off time of a PWM signal, and thus a high processing load occurs in each period. Accordingly, there is a risk that an inexpensive microcomputer having low throughput cannot complete the above-described calculation processing within one period of PWM control. Furthermore, JP-H03-98470A does not take into consideration application of the inventive technique to a plurality of inverters.

The present invention was made in view of such circumstances, and it is an object of thereof to provide a signal generating circuit, a voltage conversion device, and a signal generating method in which it is possible to make a minimum unit of values that are respectively set in m (where m is a natural number equal to or greater than 2) generating units that periodically generate PWM signals corresponding to the setting values substantially smaller than an actual minimum unit.

SUMMARY

According to one aspect of the present invention, a signal generating circuit includes: m generating units each configured to generate, as a result of a setting value from a plurality of settable values being set in accordance with a target value, a PWM signal that corresponds to the setting value, the PWM signals generated by the m generating units driving switching elements so as to control voltage conversion circuits to convert a voltage to a target voltage; and a control unit configured to set the setting values in the generating units so that a sum of (m×n) setting values for n periods of the PWM signals approximates a value that is obtained by multiplying the target value by n, wherein the control unit includes: a specifying unit configured to specify a settable value that is closest or second closest to the value that is obtained by multiplying the target value by n, at every n periods (where n is a natural number equal to or greater than 2) of the PWM signals, and the control unit divides the closest or second closest settable value that was specified by the specifying unit into the setting values for n periods that are to be set in the m generating units, and sets these setting values.

The signal generating circuit according to one aspect of the present invention may be such that the control unit further includes: a calculation unit configured to divide the settable value specified by the specifying unit by a product of m and n to obtain a quotient and a remainder; and a determination unit configured to determine, based on the quotient and the remainder that are obtained by the calculation unit, (m×n) settable values for n periods that are to be set in the generating units.

The signal generating circuit according to one aspect of the present invention may be such that the determination unit is configured to determine the (m×n) settable values for n periods, by specifying the quotient as a reference value for the (m×n) settable values for n periods, splitting the remainder into minimum units of the settable values, and adding the minimum units to at least one of the (m×n) reference values for n periods.

The signal generating circuit according to one aspect of the present invention further includes: a storage unit in which (m×n) settable values for n periods are stored in advance in association with target values, wherein the control unit is configured to read (m×n) settable values for n periods that correspond to the target value from the storage unit, and sets the read settable values in the generating units.

According to one aspect of the present invention, a voltage conversion device includes: the above-described signal generating circuit; voltage conversion circuits configured to convert a voltage using switching based on duty cycles of signals generated by the signal generating circuit, and a detection unit configured to detect the voltage converted by the voltage conversion circuits, wherein the control unit provided in the signal generating circuit includes a second calculation unit configured to calculate the target value based on the voltage detected by the detection unit.

According to one aspect of the present invention, a signal generating method in which a signal generating circuit generates PWM signals, the signal generating circuit including m generating units each configured to generate, as a result of a setting value from a plurality of settable values being set in accordance with a target value, a PWM signal that corresponds to the setting value, the PWM signals generated by the m generating units driving switching elements so as to control voltage conversion circuits to convert a voltage to a target value, the method including: specifying a settable value that is closest or second closest to a value that is obtained by multiplying the target value by n, at every n periods (where n is a natural number equal to or greater than 2) of the PWM signals; and dividing the specified closest or second closest settable value into the setting values for n periods that are to be set in the m generating units, and setting these setting values.

According to one aspect, the control unit sets settable values that are settable in the respective m generating units based on a target value. In this context, "settable value" refers to a value that is equal to an integral multiple of a minimum unit of a value that is settable in a generating unit. Specifically, the control unit specifies, at every n periods of signals that are generated by the m generating units, a settable value that approximates a value that is obtained by multiplying the target value by n, divides the specified settable value into (m×n) settable values for n periods, and sets the settable values in the m generating units for each period of the signals.

Accordingly, since (m×n) settable values for n periods that are to be set by the control unit are allocated so that a sum of the (m×n) settable values for n periods approximates a value that is obtained by multiplying a target value by n, an average value of (m×n) settable values for n periods as a whole is adjusted more finely than a minimum unit (that is, minimum increment) of the settable values.

According to one aspect, the control unit determines (m×n) settable values for n periods, based on a quotient and a remainder that are obtained by dividing the settable value specified by the specifying unit by the product of m and n.

Accordingly, the (m×n) settable values for n periods are determined by the control unit so that an average value, for n periods, of the sum of m settable values approximates the target value, and thus an average value of the (m×n) settable values for n periods as a whole is adjusted more finely than a minimum unit (that is, minimum increment) of the settable values.

According to one aspect, (m×n) settable values for n periods are determined by specifying the quotient as a result of the above-described division as a reference value for the (m×n) settable values for n periods as a whole, splitting the remainder as a result of the above-described division into minimum units (that is, minimum increments) of the settable values, and adding the value of the split minimum units to at least one of the (m×n) reference values for n periods.

Accordingly, the values obtained by splitting the remainder into minimum units are appropriately allocated to the (m×n) settable values for n periods, so that at least one of the (m×n) settable values for n periods are determined as being equal to a value obtained by adding the minimum unit value of the settable values to the reference value, and the remaining settable values except for the at least one settable value are determined as being equal to the reference value.

According to one aspect, (m×n) settable values for n periods are stored in advance in the storage unit in association with target values. The control unit reads, based on a target value, (m×n) settable values for n periods that are to be set in the m generating units from information stored in the storage unit, and sets the read settable values in the respective m generating units.

Accordingly, the (m×n) settable values for n periods that are to be set based on a target value are read from the storage unit at the time of execution of control by the control unit, and are sequentially set in the m generating units over the n periods.

According to one aspect, the voltage conversion circuits convert a voltage, using switching based on duty cycles of signals that are generated by the above-described signal generating circuit, and the control unit of the signal generating circuit calculates the above-described target value based on the converted voltage.

Accordingly, the signal generating circuit that can make a minimum unit of values that are respectively set in the m generating units that periodically generate signals substantially smaller than an actual minimum unit is applied to the voltage conversion device, thus improving the accuracy in an output voltage.

Advantageous Effects of Invention

As described above, since (m×n) settable values for n periods that are to be set by the control unit are allocated so that a sum of the (m×n) settable values for n periods approximates a value that is obtained by multiplying a target value by n, an average value of (m×n) settable values for n periods as a whole is adjusted more finely than a minimum unit (that is, minimum increment) of the settable values.

Accordingly, it is possible to make a minimum unit of values that are respectively set in m (where m is a natural number equal to or greater than 2) generating units that periodically generate PWM signals based on a setting value substantially smaller than an actual minimum unit.

BRIEF DESCRIPTION OF DRAWINGS

FIG. 7 is a table illustrating a list of (m×n) setting values for n periods that were determined based on target values.

DETAILED DESCRIPTION OF PREFERRED EMBODIMENTS

Hereinafter, the present invention will be described in detail with reference to the drawings illustrating embodiments thereof.
Embodiment 1

Figure 1:
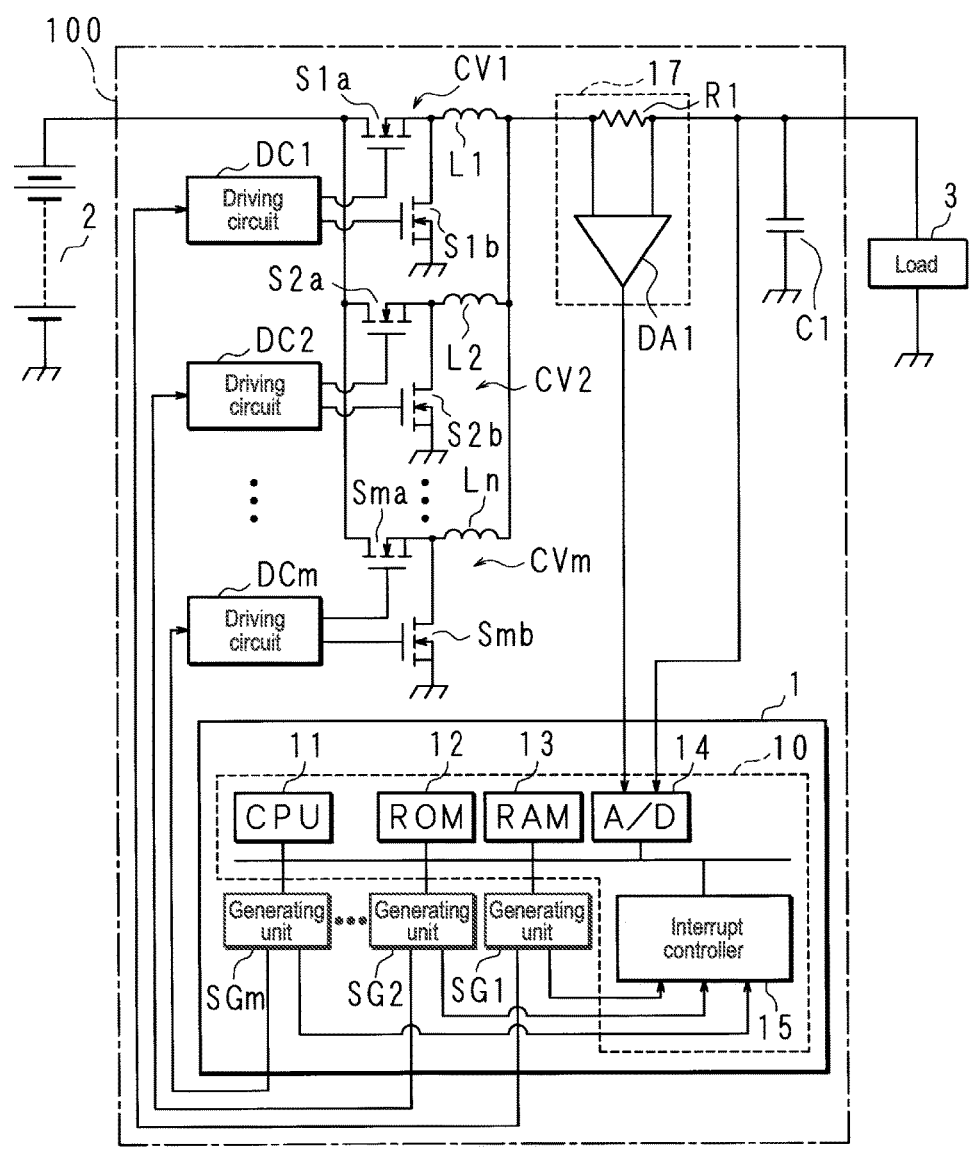
FIG. 1 is a block diagram illustrating an example of a configuration of a voltage conversion device according to Embodiment 1 of the present invention.
Figure 2:
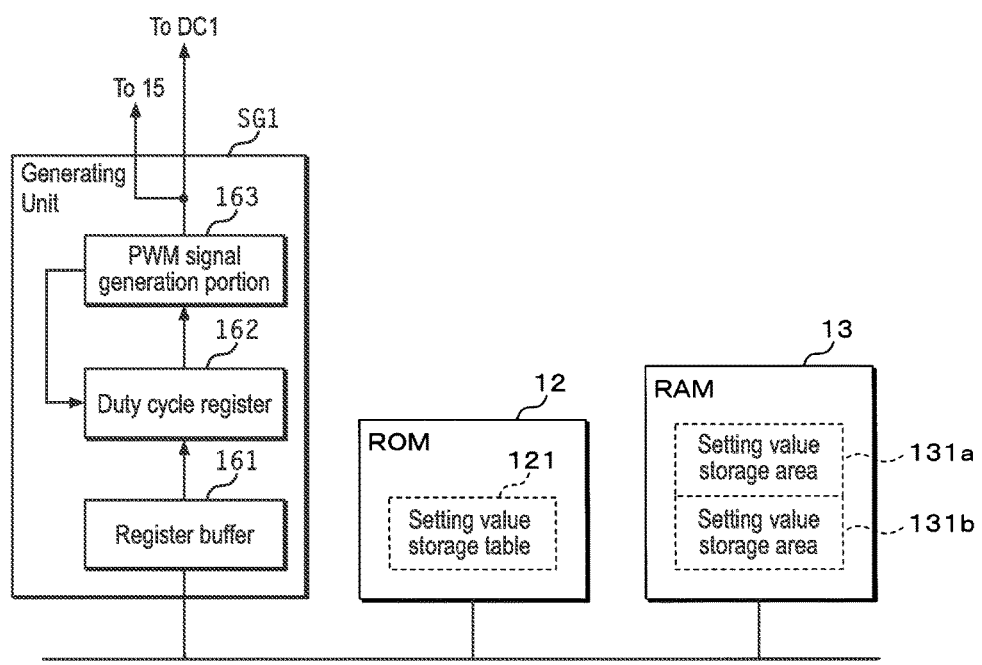
FIG. 2 is a block diagram illustrating an example of a configuration of a part of a signal generating circuit according to Embodiment 1 of the present invention.

FIG. 1 is a block diagram illustrating an example of a configuration of a voltage conversion device according to Embodiment 1 of the present invention, and FIG. 2 is a block diagram illustrating an example of a configuration of a part of a signal generating circuit according to Embodiment 1 of the present invention. In FIG. 1, the reference numeral 100 denotes the voltage conversion device. The voltage conversion device 100 is connected to a battery 2 and a load 3 that are arranged on its outside. The voltage conversion device 100 reduces (steps down) a DC voltage supplied from the battery 2, and supplies the reduced DC voltage to the load 3.

The voltage conversion device 100 is provided with: m (where m is a natural number equal to or greater than 2) converters (that correspond to "voltage conversion circuits") CV1, CV2, ... CVm that reduce DC voltages; driving circuits DC1, DC2, ... DCm that respectively drive the converters CV1, CV2, ... CVm; a signal generating circuit 1 that generates m PWM signals; a capacitor C1 that smoothes the voltages that were reduced by the respective converters CV1, CV2, ... CVm; and an electric current detection circuit 17 for detecting an output current. Output currents are supplied from the converters CV1, CV2, ... CVm to the load 3 via the electric current detection circuit 17, and a voltage to be supplied to the load 3 is applied to the signal generating circuit 1.

The converters CV1, CV2, ... CVm are so-called multiphase converters connected in parallel to each other. They may also raise (step up) a DC voltage. One converter CVk (where k is a natural number equal to or smaller than m, the same applies below) is provided with: a switching element (hereinafter referred to simply as a "switch") Ska that is an N-channel MOSFET having a drain to which a DC voltage supplied from the battery 2 is applied; an inductor Lk that has one end connected to the capacitor C1 and the other end connected to a source of the switch Ska; and a switch Skb that has a drain connected to the connection point between the switch Ska and the inductor Lk, and a grounded source. The switches Ska and Skb may be P-channel MOSFETs, or may be switching elements of another type such as bipolar transistors.

The switch Skb may be replaced by a diode whose anode is connected to a ground potential. Here the switch Skb, which has a lower ON resistance than a diode, performs so-called synchronous rectification to reduce loss of the converter CVk. If, due to the synchronous rectification, a current flowing through the inductor Lk is reversed when the converter CVk is subject to a light load, it is sufficient that, for example, a resistor is arranged in series with the inductor Lk and a current through the inductor Lk is detected. If a reversed current (going in the other direction) is detected, then the driving circuit DCk stops the ON signal for the switch Skb.

Each driving circuit DCk applies, to gates of the switches Ska and Skb, ON signals to alternately turn the switches Ska and Skb on in respective control periods based on PWM signals supplied from a generating unit SGk. The ON signal that is applied to the gate of the switch Skb has a phase that is substantially inversed relative to that of the ON signal that is applied to the gate of the switch Ska, securing a so-called dead time.

The signal generating circuit 1 is provided with: generating units SG1, SG2, ... SGm that respectively apply, to the driving circuits DC1, DC2, ... DCm, PWM signals that have phases shifted against each other by 2Π/m each; and a control unit 10 that sets data for the respective generating units SG1, SG2, ... SGm. The generating units SG1, SG2, ... SGm may also be included in the control unit 10. Hereinafter, phases of the PWM signals that are generated respectively by the generating units SG1, SG2, ... SGm are referred to as a first phase, a second phase, ... an m-th phase.

The control unit 10 includes a microcomputer provided with a CPU 11. The CPU 11 is connected, via a bus, to a ROM 12 in which information such as a program is stored, a RAM 13 in which information is temporarily stored, an A/D converter (that corresponds to a "detection unit") 14 that converts an analog voltage into a digital value, and an interrupt controller 15 that processes a plurality of interrupt requests. Furthermore, the generating units SG1, SG2, ... SGm are connected to the CPU 11 via the bus. A detection voltage from the electric current detection circuit 17 and an output voltage supplied to the load 3 are applied to the A/D converter 14.

Moving to FIG. 2, the ROM 12 includes a setting value storage table (that corresponds to a "storage unit") 121 in which a plurality of setting values are stored in advance in association with target values, which will be described later. Note that the setting value storage table 121 is not used in Embodiment 1.

The RAM 13 includes setting value storage areas 131a and 131b that are duplicated so as to enable storing and reading of a plurality of setting values at different timings. The setting values stored in the setting value storage area 131a (or 131b) are sequentially set in the generating units SG1, SG2, ... SGm by interrupt processing (described later) that is conducted by the interrupt controller 15.

The generating unit SG1 is provided with a register buffer 161 in which the setting values are set, a duty cycle register 162 into which the content of the register buffer 161 is periodically loaded, and a PWM signal generation portion 163 that generates a PWM signal having a duty cycle corresponding to the content of the duty cycle register 162. The PWM signal generation portion 163 applies, to the duty cycle register 162, a load signal for loading the content of the register buffer 161. The same applies to the other generating units SG2, SG3, ... SGm.

The PWM signal generation portion 163 generates, based on a not-shown internal clock and the content of the duty cycle register 162, a PWM signal that has an ON time that corresponds to an integral multiple of the internal clock period. The PWM signal generated by the PWM signal generation portion 163 is applied to the driving circuit DC1 and is also applied as one of the interrupt requests to the interrupt controller 15. The same applies to PWM signal generation portions 163 of the other generating units SG2, SG3, . . . SGm.

Returning to FIG. 1, the interrupt controller 15 applies, upon accepting one of the above-described interrupt requests, a signal (so-called INT signal) to the CPU 11 to request it to perform an interrupt, and transmits, upon receiving an acknowledgement signal (so-called INTA signal) from the CPU 11, an interrupt vector that corresponds to the interrupt requests to the bus. The configuration is such that, when the interrupt vector transmitted to the bus is read in the CPU 11, the CPU 11 executes interrupt processing that corresponds to the interrupt request.

The electric current detection circuit 17 includes a resistor R1 and a differential amplifier DA1. A voltage drop that has occurred in the resistor R1 due to an output current is amplified by the differential amplifier DA1 to serve as a detected voltage that corresponds to the output current, and is converted into a digital value by the AM converter 14.

In the above-described configuration, currents flowing from the battery 2 to the inductors L1, L2, . . . Lm are switched with the ON signals that are applied from the driving circuits DC1, DC2, . . . DCm to the switches S1a, S2a, . . . Sma at a phase difference of $2\pi/m$, and during OFF periods of the switches S1a, S2a, . . . Sma, the currents flowing through the inductors L1, L2, . . . Lm are returned to the switches S1b, S2b, . . . Smb.

Accordingly, the currents that flow from the inductors L1, L2, . . . Lm toward the load 3 at phase differences of $2\Pi/m$ are summed up, and thereby electric powers that are output by the converters CV1, CV2, . . . CVm are summed up. A timing diagram that shows the temporal relation between ON signals that are applied to the switches S1a, S2a, . . . Sma at a phase difference of $2\Pi/m$, currents flowing through the inductors L1, L2, . . . Lm, and output currents that are summed up and have reduced ripples is disclosed in detail in JP 2013-46541A.

Meanwhile, the CPU 11 of the signal generating circuit 1 controls a voltage to be supplied to the load 3 by, for example, a current mode control method in which voltage loop control and current loop control are executed in parallel. In the voltage loop control, the CPU 11 calculates an operation amount, which serves as a target current value in the current loop control of the subsequent stage, based on a deviation obtained by subtracting a digital value into which an output voltage supplied to the load 3 is AM converted from a target voltage value. In this voltage loop control, voltages that are respectively output from the converters CV1, CV2, . . . CVm serve as control amounts.

In the current loop control, the CPU 11 calculates an operation amount with respect to the m generating units SG1, SG2, . . . SGm as a whole, based on a deviation obtained by subtracting a digital value into which an output current supplied to the load 3 is AM converted from the target current value obtained in the voltage loop control of the previous stage. The CPU 11 further determines settable values that are settable in the respective generating units SG1, SG2, . . . SGm based on the calculated operation amount (hereinafter, referred to as "target value"). In this context, "settable value" refers to a value that is equal to an integral multiple of a minimum unit (minimum increment) that is reflected in a change in an output PWM signal when it is set in the generating units SG1, SG2, . . . SGm. Hereinafter, for simplicity, settable values that were determined to be set respectively in the generating units SG1, SG2, . . . SGm are referred to as "setting values". As a result of the determined setting values being set, the generating units SG1, SG2, . . . SGm respectively generate PWM signals having duty cycles that correspond to the setting values. In this current loop control, currents that are respectively output from the converters CV1, CV2, . . . CVm serve as control amounts.

Here, if output voltages and output currents of the voltage conversion device 100 change relatively smoothly over time, it can be sufficient that the above-described voltage loop control and current loop control are performed in a period that is n times (where n is a natural number equal to or greater than 2) the PWM period. Accordingly, in Embodiment 1, every n PWM periods, setting values for n periods are collectively determined for the m generating units SG1, SG2, . . . SGm, and are stored in the setting value storage area 131a or 131b. The m setting values for each period are sequentially set in the generating units SG1, SG2, . . . SGm by interrupt processing that occurs at the PWM period, and this process is repeated over n periods.

Hereinafter, for simplicity, it is assumed that m=n=3, but the present invention is not limited to this, and m and n may be equal to or greater than 2 or 4 respectively, and may also be different from each other. Furthermore, m setting values are not necessarily set in all of the generating units SG1, SG2, . . . SGm in each period, and may also be set only in those generating units in which the setting values change between a given period and the subsequent period.

The following will describe how the PWM signal generation portion 163 generates a PWM signal that corresponds to the content of the duty cycle register 162 taking the generating unit SG1 that generates a first-phase PWM signal as an example.

Figure 3:
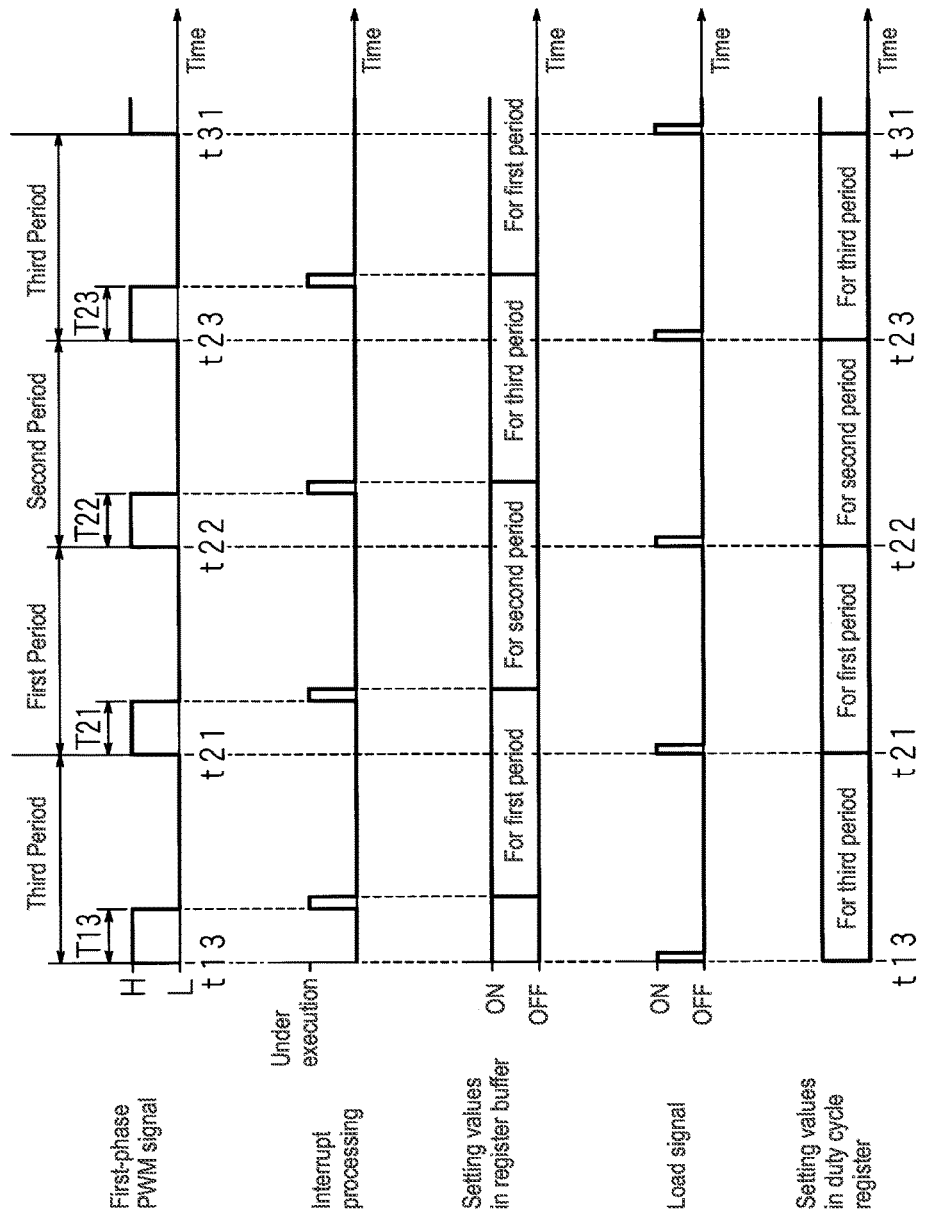
FIG. 3 is a timing diagram illustrating an operation of a generating unit.

FIG. 3 is a timing diagram illustrating an operation of the generating unit SG1. All of five timing charts shown in FIG. 3 have the same time axis as the horizontal axis, and the vertical axis shows, from top to bottom, a signal level of the first-phase PWM signal, an execution state of interrupt processing that is executed based on the first-phase PWM signal, content of the register buffer 161 of the generating unit SG1, an on/off state of a load signal for loading the content of the register buffer 161 into the duty cycle register 162, and a content of the duty cycle register 162 of the generating unit SG1.

A PWM signal of each phase has a first period, from a time t21 to a time t22, a second period from the time t22 to a time t23, and a third period from the time t23 to a time t31, that is, n periods (with n=3). The time t13 to the time t21 is the third period of the previous n periods. A timing at which the first-phase PWM signal rises is coincident with a point in time when each period starts. Timings at which a second-phase PWM signal, a third-phase PWM signal, . . . an m-th-phase PWM signal respectively rise, and timings at which associated processing is executed, signals are applied, and the like are such that their phases are delayed from the timings shown in FIG. 3 by $2\Pi/m$, $2\Pi\times2/m$, . . . $2\Pi\times(m-1)/m$.

A falling edge of a PWM signal at which its signal level changes from H to L in each period is received as an interrupt request by the interrupt controller 15, and interrupt processing is executed once. Specifically, interrupt processing is executed when the ON time periods T13, T21, T22, and T23 in the respective periods have elapsed from the times t13, t21, t22, and t23. In the interrupt processing, a setting value for use in the subsequent PWM period is read from the setting value storage area 131a or 131b included in the RAM 13, and is set in the register buffer 161.

Storing the setting values in the setting value storage area 131a (or 131b) is performed during the n periods in which reading from the setting value storage area 131b (or 131a) is performed, and that are prior to the period in which reading from the setting value storage area 131a (or 131b) starts. For example, setting values that are read from the setting value storage area 131a (or 131b) in the third period, the first period, and the second period that are successive from the time t13 are calculated and stored in the setting value storage area 131a (or 131b) during the third period, the first period, and the second period prior to the time t13. In this case, reading of setting values during the fourth period, the first period, the second period, and the third period prior to a time t14 is performed from the setting value storage area 131b (or 131a).

The m setting values for each of the first period, the second period, and the third period that are stored in the setting value storage area 131a (or 131b) are sequentially read by phase-specific interrupt processes in the third period, the first period, and the second period after the setting values have been stored, and are set in the register buffers 161 of the corresponding generating units. Accordingly, in the phase-specific interrupt processes that are performed in the third period, the first period, and the second period, the content of the register buffers 161 of the corresponding generating units is overwritten with the setting values for the first period, the second period, and the third period.

On the other hand, at rising edges of the PWM signal at which its signal level changes from L to H, that is, at the times t13, t21, t22, t23, and t31, the PWM signal generation portion 163 applies, to the duty cycle register 162, a load signal for loading the content of the register buffer 161. Accordingly, during the first period, the second period, and the third period, the content of the duty cycle register 162 is maintained as the setting values for the first period, the second period, and the third period. Based on these setting values, duty cycles of the PWM signal in the first period, the second period, and the third period are determined.

The following will describe a specific example in which setting values that correspond to a target value are set in the generating units SG1, SG2, and SG3.

Figure 4:
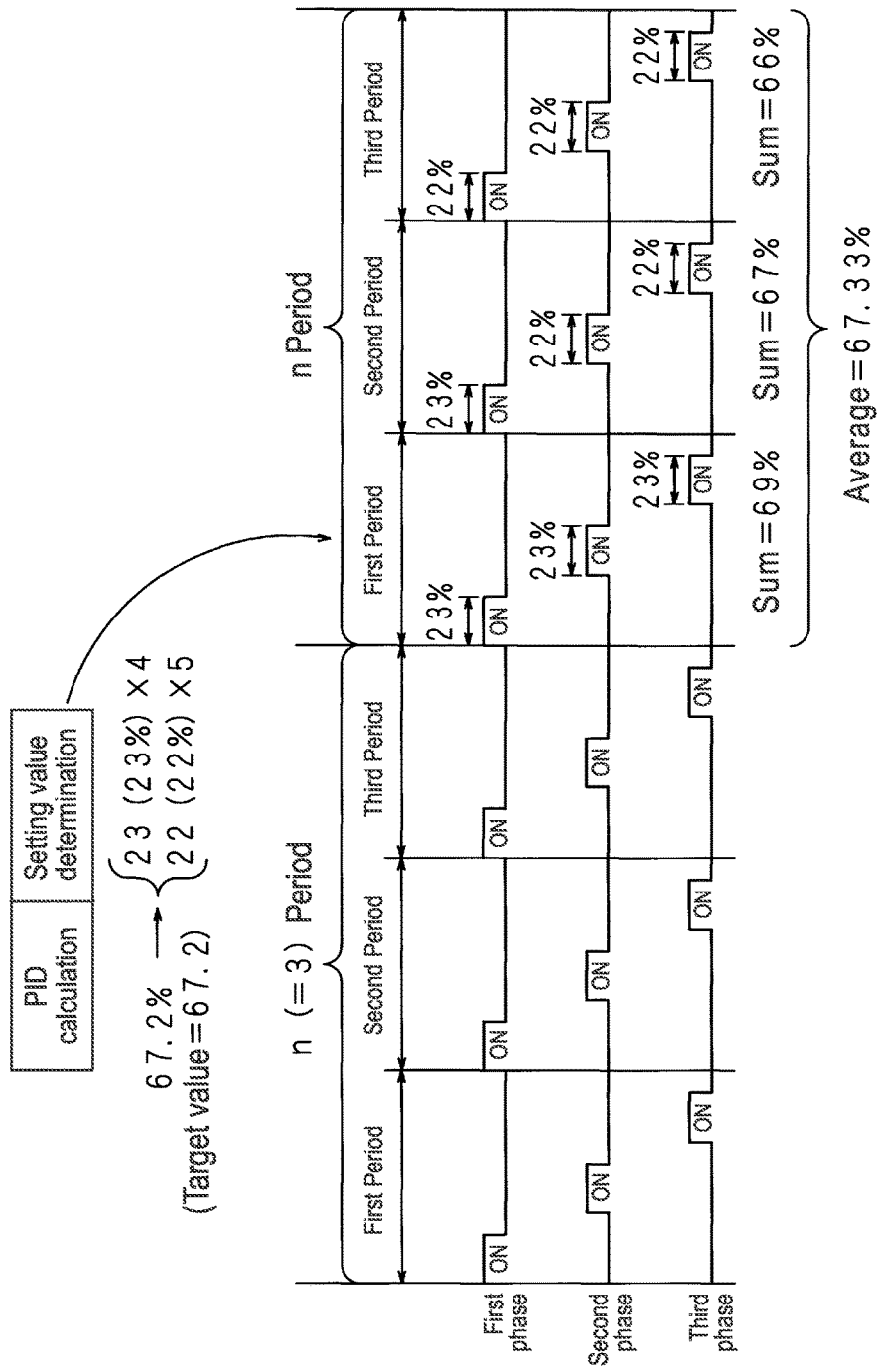
FIG. 4 is a diagram illustrating an operation in which typical duty cycles of PWM signals are determined based on (m×n) setting values for n periods.

FIG. 4 is a diagram illustrating an operation in which typical duty cycles of PWM signals are determined based on (m×n) setting values for n periods. In the drawing, the horizontal axis denotes time, and the vertical axis shows the signal levels of the first-phase PWM signal, the second-phase PWM signal, and the third-phase PWM signal. FIG. 4 shows a condition in which the first to third-phase PWM signals change between on and off in the first PWM periods, the second PWM periods, and the third PWM periods of two series of n periods. Also here, for simplicity, it is assumed that m=n=3.

In Embodiment 1, the period of the PWM signals that are generated by the generating units SG1, SG2, and SG3 is 10 μs, and a minimum unit (that is, a minimum increment) of setting values that are settable in the generating units SG1, SG2, and SG3 is 1, the minimum unit "1" corresponding to a duty cycle of 1% of the PWM signals (that is, an ON time period of 0.1 μs). In other words, the duty cycles of the PWM signals that are generated by the generating units SG1, SG2, and SG3 can be set in units of 1%. On the other hand, it is assumed that the minimum unit of a target duty cycle that is calculated by the CPU 11 using PID calculation is 0.1%.

In the timing shown in FIG. 4, a case is considered in which a result of the PID calculation of the previous n periods is 67.2%. This means that a target value, which corresponds to the sum of the values to be set in the generating units SG1, SG2, and SG3, is 67.2. If this target value is divided by 3, the setting values that are settable in the generating units SG1, SG2, and the SG3 are determined as 22 or 23, which are closest to 22.4 (=67.2/3), and the sum of the duty cycles of the PWM signals in each period is equal to 66% or 69%, resulting in a deviation from the target duty cycle of 67.2% by 1.2% or 1.8%.

Therefore, in Embodiment 1, "202" is specified as a settable value that is closest to the value obtained by multiplying the target value by n (67.2×3=201.6), and the specified "202" is divided into (n×m) settable values as evenly as possible so that (n×m) settable values for the next n periods are determined. The settable value that is specified here may also be "201", for example, which is the second closest to the value obtained by multiplying the target value by n, or another value, but may preferably be set to "202", which is the closest. Specifically, of the n×m=9 setting values, four setting values are set to "23" (which corresponds to a duty cycle of 23%), and five setting values are set to "22" (which corresponds to a duty cycle of 22%). More specifically, the setting values to be set in the generating units SG1, SG2, and SG3 in the first period, the second period, and the third period of the next n periods are determined as: 23, 23, 23; 23, 22, 22; and 22, 22, 22, for example.

Accordingly, the duty cycles of the first-phase PWM signal, the second-phase PWM signal, the third-phase PWM signal in the first period, the second period, and the third period of the next n periods are set as: 23%, 23%, 23%; 23%, 22%, 22%; and 22%, 22%, 22%. That is, the sums of the duty cycles of the first to third-phase PWM signals are equal to 69%, 67%, and 66% in the respective first, second, and third periods, and an average of the sums over the n periods is equal to 67.33%, showing that the deviation from 67.2%, which is the target duty cycle, can be kept within 0.13%.

The above-described setting values may also be determined as: for example, 23, 23, 22; 23, 22, 22; and 23, 22, 22, or 23, 23, 22; 22, 23, 22; and 22, 22, 23. In other words, any combination of the setting values 22 and 23 from among the (m×n) setting values for n periods is possible, with the purpose of preventing a voltage variation, for example. By determining (m×n) setting values for n periods in this way, it is possible to determine the sum of the setting values to be set in the generating units SG1, SG2, and the SG3 for each period in units of 1, and to determine an average of sums over n periods in units of 0.33.

The following will describe an operation of the signal generating circuit 1 that determines the above-described (m×n) setting values for n periods with reference to the flowcharts showing the operation. The processing described below is executed by the CPU 11 in accordance with a control program stored in advance in the ROM 12.

Figure 5:
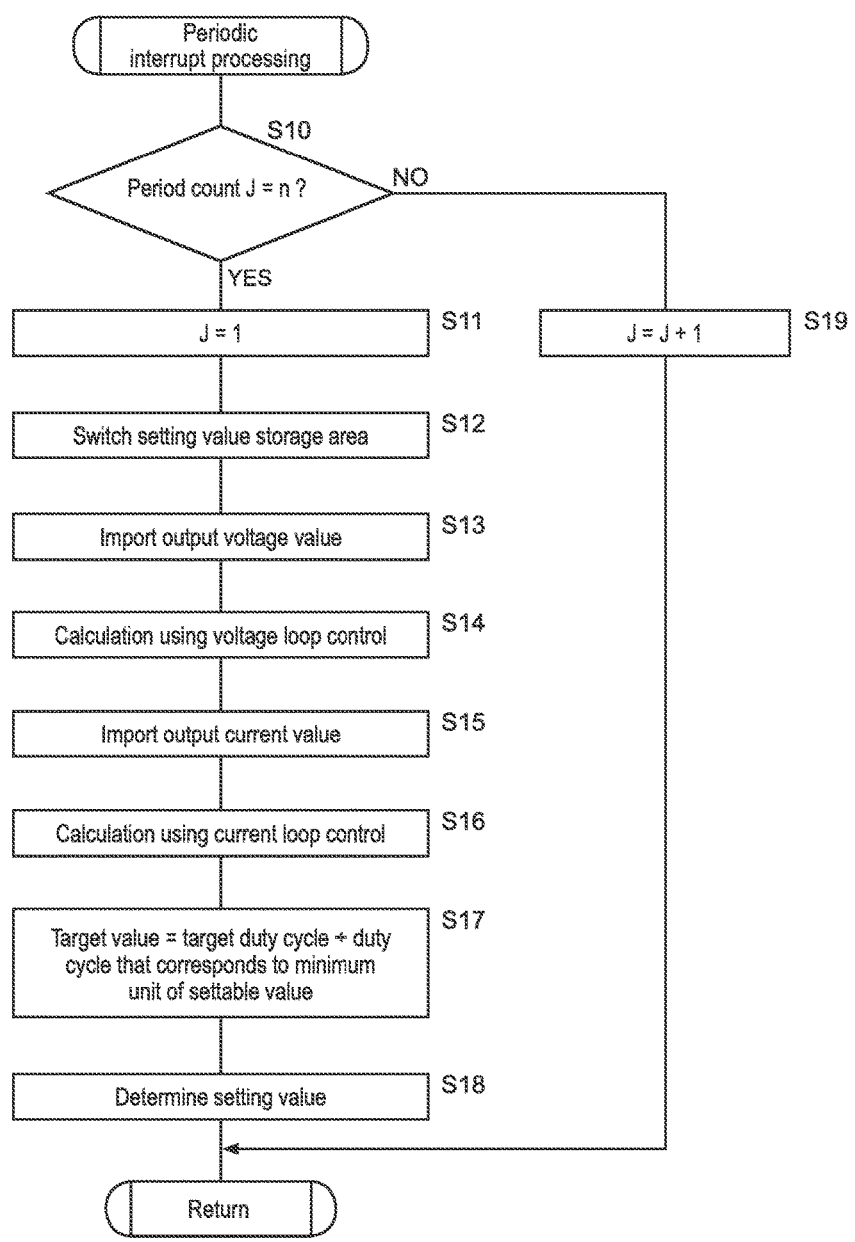
FIG. 5 is a flowchart illustrating a procedure of processing of a CPU when the signal generating circuit according to Embodiment 1 of the present invention executes periodic interrupt processing.
Figure 6:
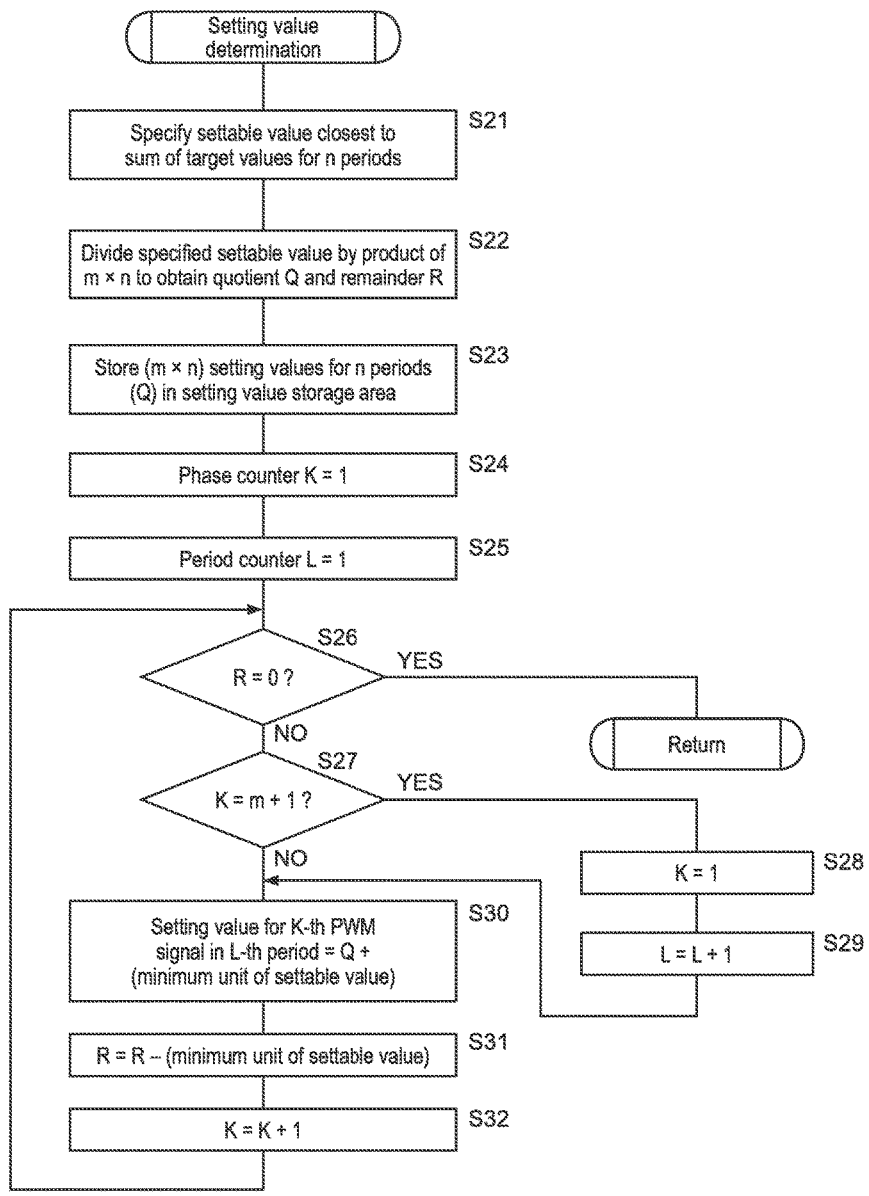
FIG. 6 is a flowchart illustrating a procedure of processing in which the CPU performs a setting value determination subroutine.

FIG. 5 is a flowchart illustrating a procedure of processing of the CPU 11 when the signal generating circuit 1 according to Embodiment 1 of the present invention executes periodic interrupt processing, and FIG. 6 is a flowchart illustrating a procedure of processing in which the CPU 11 performs a setting value determination subroutine.

A period count J in FIG. 5, information indicating which of the setting value storage areas 131a and 131b is used for storage (or reading), and a phase counter K and a period counter L that are shown in FIG. 6 are stored in the RAM 13. An initial value of the period count J is n. The (m×n) setting values for n periods that are determined in the processing of FIG. 6 are sequentially stored in successive addresses in the setting value storage area 131a or 131b. A periodic interrupt that serves as a trigger for the periodic interrupt processing shown in FIG. 5 occurs at a point in time when each of the n periods starts. For example, a configuration is possible in which a periodic interrupt occurs at a rising edge of the first-phase PWM signal that is generated by the generating unit SG1.

When a periodic interrupt has occurred and the control of the CPU 11 has shifted to the processing of FIG. 5, the CPU 11 determines whether or not the period count J is n (here, 3) (step S10), and if it is n (Yes in step S10), J is set to 1 (step S11), and the setting value storage areas 131a and 131b are switched between being for storage and for reading (step S12). For example, if the setting value storage area 131b (or 131a) is used for storage before the processing of step S12, then the setting value storage area 131a (or 131b) is switched to being for storage in the processing of step S12, and the setting value storage area 131b (or 131a) is switched to being for reading.

The setting value storage area 131a (or 131b) that has been switched to being for storage in step S12 serves as an area in which (m×n) setting values for n periods that are determined by the setting value determination subroutine are to be stored. On the other hand, the setting value storage area 131b (or 131a) that has been switched to being for reading serves as an area from which setting values are to be read by phase-specific interrupt processing, which will be described later.

Then, the CPU 11 imports an output voltage value into which an output voltage to be supplied to the load 3 is converted by the A/D converter 14 (step S13), and executes a calculation using the voltage loop control based on the imported voltage value and a target voltage value (step S14) to obtain a target current value serving as an operation amount.

Then, the CPU 11 imports an output current value into which a voltage detected by the electric current detection circuit 17 is converted by the A/D converter 14 (step S15), and executes a calculation using the current loop control based on the imported current value and a target current value (step S16) to obtain a target duty cycle serving as an operation amount (that corresponds to a part of a "second calculation unit"). It is also possible that steps S15 and S16 are not executed so that the current loop control is omitted. If steps S15 and S16 are not executed, then a value that is calculated in step S14 serves as a target duty cycle.

Then, the CPU 11 divides the target duty cycle by the duty cycle that corresponds to the minimum unit of settable values to obtain a target value (step S17: corresponding to another part of the "second calculation unit"). In the example shown in FIG. 4, the target duty cycle is 0.672, and the minimum unit of the settable values is 1, the minimum unit "1" corresponding to a duty cycle of 1% (=0.01) of the PWM signals, and thus the target value is calculated as 0.672÷0.01=67.2.

Then, the CPU 11 invokes and executes the setting value determination subroutine (step S18), and then returns to the interrupted routine. On the other hand, if J is not n in step S10 (No in step S10), the CPU 11 increments J by 1 (step S19), and then returns to the interrupted routine. In other words, after every n periodic interrupts, the processing from step S11 to step S18 is executed once, and (m×n) setting values for n periods are determined.

Moving to FIG. 6, when the setting value determination subroutine has been invoked from the periodic interrupt processing, the CPU 11 multiplies the target value by n to calculate a sum of the target values for n periods, and specifies a settable value that is closest to the calculated sum for n periods (step S21: corresponding to "specifying unit"). In the example shown in FIG. 4, since the target value is 67.2, a sum for n periods is calculated as 67.2×3=201.6, and the closest settable value is specified as "202".

Then, the CPU 11 divides the specified settable value by a product of m (the number of phases)×n (the number of periods) to obtain a quotient Q and a remainder R (step S22: corresponding to "calculation unit"). In the example shown in FIG. 4, the settable value 202 is divided by a product of 3×3, the quotient Q is 22, and the remainder R is 4.

Then, the CPU 11 temporarily sets all of the (m×n) setting values for the n periods to the quotient Q, and stores them in the setting value storage area 131a or 131b (step S23). Here, the "quotient Q" corresponds to a reference value for n periods of the respective m settable values. Which of the setting value storage areas 131a and 131b is used for storage is specified in the switching processing in step S12 shown in FIG. 5. Then, the CPU 11 resets the phase counter K to 1 (step S24), and further resets the period counter L to 1 (step S25).

Then, the CPU 11 determines whether or not the remainder R calculated in step S22 (if step S31, which will be described later, has been executed, a remainder R as a result of calculation of step S31) is 0 (step S26), and if the remainder R is 0 (Yes in step S26), the CPU 11 returns to the invoked routine. The remainder R being 0 means either that the processing in which the remainder R obtained as a result of the division is split into minimum units of the settable values and the minimum units are added to at least one of the reference values is complete, or that the remainder R to be split into minimum units is 0 from the beginning.

If the remainder R is not 0 (No in step S26), the CPU 11 determines whether or not the phase counter K is "m+1", that is, the phase counter K has overflowed (step S27). If the phase counter K is "m+1" (Yes in step S27), the CPU 11 resets the phase counter K to 1 (step S28), and increments the period counter L by 1 (step S29).

If the phase counter is not "m+1" (No in step S27), or the processing in step S29 is complete, the CPU 11 sets the setting value for generating the K-th PWM signal in the L-th period to the sum of the quotient Q and the minimum unit of the settable value (step S30), and writes it over the setting value (Q) that is already stored in the setting value storage area 131a or 131b. In the example shown in FIG. 4, since the minimum unit of the settable value is 1, the processing in step S30 can be replaced by processing for incrementing the setting value stored in the setting value storage area 131a or 131b by 1.

Then, the CPU 11 sets the value obtained by subtracting the minimum unit of the settable value from the remainder R as the new remainder R (step S31), increments the phase counter K by 1 (step S32), and advances the procedure to step S26. By repeating the above-described processing from step S26 to step S32 (corresponding to "determination unit"), if the remainder R calculated in step S22 is not 0, the remainder R is split into minimum units of the settable values, and the minimum units are sequentially added to one or more reference values of the setting values.

The following will describe specific examples of the (m×n) setting values for n periods that are determined in the above-described manner.

FIG. 7 is a table illustrating a list of (m×n) setting values for n periods that are determined based on a target value. Target values are expressed as numerical values with one or two decimal places. Note that, in FIG. 7, with respect to the (m×n) setting values for n periods that are indicated in the same row, any combination of setting values may be used. Furthermore, adjacent rows having overlapping boundaries of target value ranges means that, if a target value matches the value on the boundaries, the setting values indicated in either of the rows are determined.

For example, if a target value is within the range from 29.83 to 30.17, then the (m×n) setting values for n periods, that is, the setting values for respectively generating the first-phase, second-phase, and third-phase PWM signals in the first period, the second period, and the third period are determined as 10, 10, 10; 10, 10, 10; and 10, 10, 10. In this case, the average of the sum of the setting values for each period is equal to 30.00 over the n periods. If a target value is within the range from 30.17 to 30.50, then the (m×n) setting values for n periods are determined as 11, 10, 10; 10, 10, 10; and 10, 10, 10. In this case, the average of the sum of the setting values for each period is equal to 30.33 over the n periods. If a target value is within the range from 30.50 to 30.83, then the (m×n) setting values for n periods are determined as 11, 11, 10; 10, 10, 10; and 10, 10, 10. In this case, the average of the sum of the setting values for each period is equal to 30.67 over the n periods.

If a target value is within the range from 59.83 to 60.17, then the (m×n) setting values for n periods are determined as 20, 20, 20; 20, 20, 20; and 20, 20, 20. In this case, the average of the sum of the setting values for each period is equal to 60.00 over the n periods. If a target value is within the range from 60.17 to 60.50, then the (m×n) setting values for n periods are determined as 21, 20, 20; 20, 20, 20; and 20, 20, 20. In this case, the average of the sum of the setting values for each period is equal to 60.33 over the n periods.

If a target value is within the range from 66.83 to 67.17, then the (m×n) setting values for n periods are determined as 23, 23, 23; 22, 22, 22; and 22, 22, 22. In this case, the average of the sum of the setting values for each period is equal to 67.00 over the n periods. If a target value is within the range from 67.17 to 67.50, then the (m×n) setting values for n periods are determined as 23, 23, 23; 23, 22, 22; and 22, 22, 22. In this case, the average of the sum of the setting values for each period is equal to 67.33 over the n periods. If a target value is within the range from 67.50 to 67.83, then the (m×n) setting values for n periods are determined as 23, 23, 23; 23, 23, 22; and 22, 22, 22. In this case, the average of the sum of the setting values for each period is equal to 67.67 over the n periods. If a target value is within the range from 67.83 to 68.17, then the (m×n) setting values for n periods are determined as 23, 23, 23; 23, 23, 23; and 22, 22, 22. In this case, the average of the sum of the setting values for each period is equal to 68.00 over the n periods. If a target value is within the range from 68.17 to 68.50, then the (m×n) setting values for n periods are determined as 23, 23, 23; 23, 23, 23; and 23, 22, 22. In this case, the average of the sum of the setting values for each period is equal to 68.33 over the n periods.

The following will describe the reading of the (m×n) setting values for n periods that are stored in the setting value storage area 131a or 131b.

Figure 8:
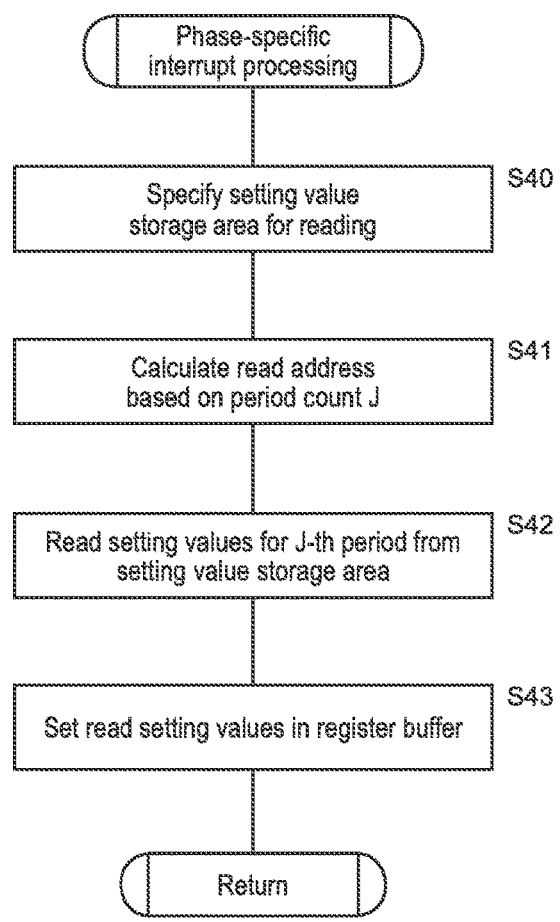
FIG. 8 is a flowchart illustrating a procedure of processing of the CPU when the signal generating circuit according to Embodiment 1 of the present invention executes phase-specific interrupt processing.

FIG. 8 is a flowchart illustrating a procedure of processing of the CPU 11 when the signal generating circuit 1 according to Embodiment 1 of the present invention executes phase-specific interrupt processing. In FIG. 8, the period count J denotes a count that is updated by the periodic interrupt processing shown in FIG. 5, and is stored in the RAM 13. The phase-specific interrupts that serves as triggers for the phase-specific interrupt processing shown in FIG. 8 occur at falling edges of the PWM signals that are respectively generated by the generating units SG1, SG2, ... SGm shown in FIG. 1.

When a phase-specific interrupt has occurred and the control of the CPU 11 has shifted to the processing in FIG. 8, the CPU 11 specifies which of the setting value storage area 131a or 131b is used for reading (step S40), and calculates read addresses in the specified setting value storage area 131a (or 131b) from which setting values are to be read, based on the period count J (step S41). The read addresses here correspond to memory addresses in which the setting values are stored in steps S23 and S30 in the setting value determination subroutine shown in FIG. 6.

Then, the CPU 11 reads one of the setting values for the J-th period from the specified setting value storage area 131a (or 131b) (step S42), sets the read setting value in the register buffer 161 of the generating unit that has generated the phase-specific interrupt (step S43), and returns to the interrupted routine.

According to Embodiment 1, as described above, the CPU 11, which functions as the main part of the control unit 10, determines setting values that are settable in m (=3) generating units SG1, SG2, and SG3, based on the target value corresponding to the sum of values that are respectively to be set in the m generating units SG1, SG2, and SG3, and sets the determined setting values in the generating units. Specifically, the CPU 11 specifies, for every n (=3) period of the PWM signals that are generated by the m generating units SG1, SG2, and SG3, a settable value that is closest to the sum of the target values for n periods, and divides the specified settable value substantially evenly into the (m×n) setting values for n periods. More specifically, the CPU 11 determines (m×n) setting values for n periods, based on a quotient Q and a remainder R that are obtained by dividing the specified settable value by the product of m and n, and sets them in the respective generating units SG1, SG2, and SG3 by phase-specific interrupt processes that are different from each other between periods of the PWM signals.

Accordingly, since the (m×n) setting values for n periods are determined by the CPU 11 so that an average value, for n periods, of the sum of m settable values approximates the target value, and thus an average value of the (m×n) setting values for n periods as a whole is adjusted more finely than a minimum unit (that is, minimum increment) of the setting values.

Accordingly, it is possible to make a minimum unit of values that are respectively set in the m generating units SG1, SG2, ... SGm that periodically generate PWM signals based on a setting value substantially smaller than an actual minimum unit.

Furthermore, according to Embodiment 1, a quotient Q obtained as a result of the above-described division is specified as a reference value for the (m×n) settable values for n periods as a whole, and a remainder R obtained as a result of the above-described division is split into minimum units (that is, minimum increments=1) of the settable values, and the value of the split minimum units is added to at least one of m reference values for each of n periods to determine (m×n) setting values for n periods.

Accordingly, the values (=1) obtained by splitting the remainder R into minimum units are appropriately allocated to at least one of the (m×n) setting values for n periods, so that at least one of the (m×n) setting values for n periods can be determined as being equal to a value obtained by adding the minimum unit value of the settable values to the reference value, and the remaining settable values except for the at least one setting value can be determined as being equal to the reference value.

Embodiment 2

While Embodiment 1 concerns an aspect in which the determined (m×n) setting values for n periods are temporarily stored in the setting value storage area 131a or 131b included in the RAM 13, and then sequentially read in PWM periods, Embodiment 2 concerns an aspect in which (m×n) setting values for n periods are sequentially read from content stored in advance in the setting value storage table 121 included in the ROM 12 in PWM periods.

A voltage conversion device 100 and a signal generating circuit 1 of Embodiment 2 have the same structures as those shown in FIGS. 1 and 2 of Embodiment 1. Note that in Embodiment 2, the setting value storage areas 131a and 131b included in the RAM 13 are not used. In the setting value storage table 121 included in the ROM 12, multiple sets of (m×n) setting values for n periods that are associated with the respective target value ranges shown in FIG. 7 of Embodiment 1 are stored in advance. The setting value storage table 121 may be included in another external memory of the control unit 10. By the interrupt processing that is performed at each of n periods, one of the multiple sets of m setting values for each of n periods that are stored in the setting value storage table 121 is read.

The timing chart of Embodiment 2 that shows the operation of the generating unit SG1 is the same as that in FIG. 3 of Embodiment 1. Similarly, an operation in Embodiment 2 in which the signal generating circuit 1 determines typical duty cycles of the PWM signals based on the (m×n) setting values for n periods will be apparent from the diagram shown in FIG. 4 of Embodiment 1.

In addition, the same reference numerals are given to the structures corresponding to those of Embodiment 1, and descriptions thereof are omitted.

The (m×n) setting values for n periods that are stored in the setting value storage table 121 are sequentially read out by phase-specific interrupt processes of a third period, a first period, and a second period that are successive to each other, and are set in the register buffers 161 of the corresponding generating units.

The following will describe an operation of the signal generating circuit 1 that sets (m×n) setting values for n periods with reference to the flowcharts illustrating the operation.

Figure 9:
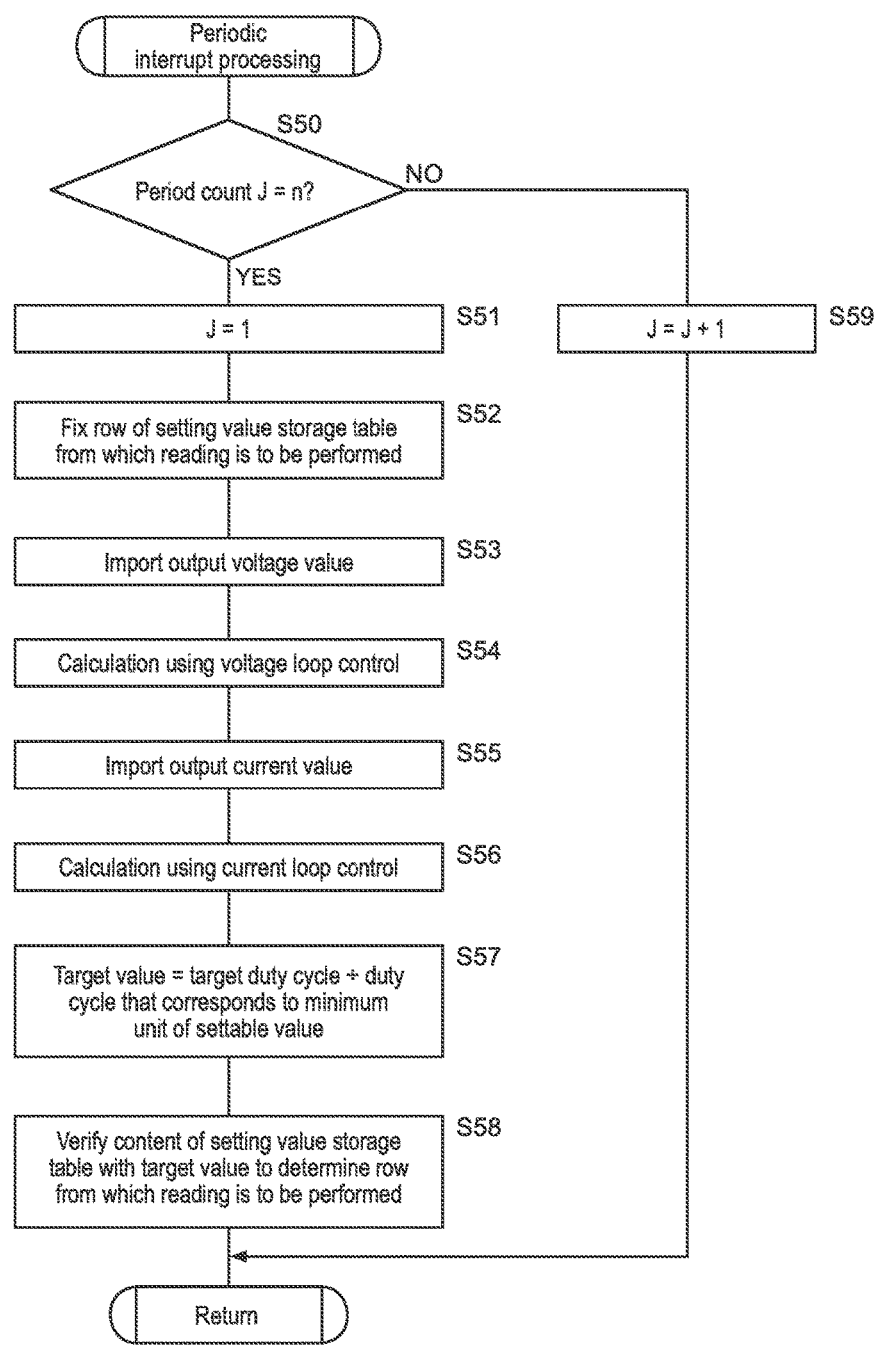
FIG. 9 is a flowchart illustrating a procedure of processing of a CPU when a signal generating circuit according to Embodiment 2 of the present invention executes periodic interrupt processing.
Figure 10:
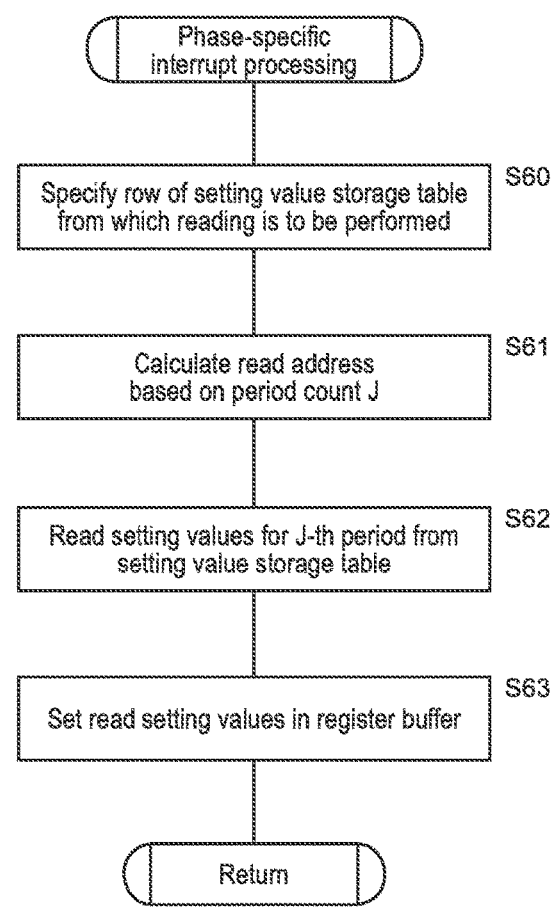
FIG. 10 is a flowchart illustrating a procedure of processing of the CPU when the signal generating circuit according to Embodiment 2 of the present invention executes phase-specific interrupt processing.

FIG. 9 is a flowchart illustrating a procedure of processing of the CPU 11 when the signal generating circuit 1 according to Embodiment 2 of the present invention executes periodic interrupt processing, and FIG. 10 is a flowchart illustrating a procedure of processing of the CPU 11 when the signal generating circuit 1 according to Embodiment 2 of the present invention executes phase-specific interrupt processing. The timings at which the interrupt processing occurs are the same as in Embodiment 1.

Note that the processes from step S50 to step S59 shown in FIG. 9 except for steps S52, S57, and S58 are the same as the processes from step S10 to step S19 shown in FIG. 5 of Embodiment 1, and thus a part of the description will be omitted.

When a periodic interrupt has occurred and the control of the CPU 11 has shifted to the processing of FIG. 9, the CPU 11 determines whether or not the period count J is n (here, 3) (step S50), and if the period count J is n (Yes in step S50), the CPU 11 sets the period count J to 1 (step S51), and fixes a row of the setting value storage table 121 from which reading is to be performed to the row (see step S58, which will be described later) that was determined in the previous periodic interrupt processing (step S52).

Then, the CPU 11 executes a calculation according to the voltage loop control based on an output voltage, and the current loop control based on an output current (steps S53 to S56) to obtain a target duty cycle (corresponding to a part of the "second calculation unit"). Furthermore, the CPU 11 divides the calculated target duty cycle by the duty cycle (here, 0.01) that corresponds to a minimum unit of settable values to obtain a target value (step S57: corresponding to another part of the "second calculation unit").

Then, the CPU 11 verifies the target value obtained by the above-described calculation with the content of the setting value storage table 121, that is, the target value ranges stored in the table, to determine a row from which reading is to be performed (step S58), and then returns to the invoked routine. As a result of the verification, n setting values for each of n periods that are stored in the setting value storage table 121 in association with the range containing the target value serve as the setting values that are to be read in the invoked routine.

Then, when a phase-specific interrupt has occurred and the control of the CPU 11 has shifted to the processing of FIG. 10, the CPU 11 specifies a row of the setting value storage table 121 from which reading is to be performed (step S60), and calculates read addresses for the setting values in the specified row based on the period count J (step S61). The row specified here is the row that is fixed in the processing in step S52 shown in FIG. 9.

Then, the CPU 11 reads one of the setting values for the J-th period from the specified row of the setting value storage table 121 (step S62), sets the read setting value in the register buffer 161 of the generating unit that has generated the phase-specific interrupt (step S63), and returns to the interrupted routine.

According to Embodiment 2, as described above, (m×n) setting values for n periods are stored in advance in the setting value storage table 121 in association with target values. The CPU 11 reads (m×n) setting values for n periods that are to be set in m generating units SG1, SG2, . . . SGm based on a target value from information stored in the setting value storage table 121.

Therefore, it is possible to read (m×n) setting values for n periods that are to be set in accordance with a target value from the storage unit at the time of execution of control by the CPU 11.

Furthermore, according to Embodiment 2, the CPU 11 sequentially reads m setting values from the setting value storage table 121 in each period of PWM control, and sets them in m generating units SG1, SG2, . . . SGm.

Accordingly, it is possible to set the content of the setting value storage table 121 sequentially in the m generating units SG1, SG2, . . . SGm over n periods.

Furthermore, according to Embodiment 1 or 2, the converters CV1, CV2, . . . CVm convert a voltage, using switching based on the duty cycles of PWM signals that are generated by the above-described signal generating circuit 1, and the CPU 11 of the signal generating circuit 1 calculates the above-described target value using PWM control based on the converted voltage.

Accordingly, it is possible to apply the signal generating circuit 1 that can make a minimum unit of values that are respectively set in the m generating units SG1, SG2, . . . SGm that periodically generate PWM signals substantially smaller than an actual minimum unit to the voltage conversion device 100, thus improving the accuracy in an output voltage.

The embodiments disclosed herein are exemplary in all respects, and should be construed as being not limitative. The scope of the present invention is defined by the claims rather than the meaning described above, and is intended to include all modifications within the scope and meaning equivalent to the claims. Furthermore, technical features disclosed in the embodiments can be combined with each other.

The invention claimed is:

1. A signal generating circuit comprising:
at least two generating units each configured to generate, as a result of a setting value from a plurality of settable values being set in accordance with a target value, a PWM signal that corresponds to the setting value, the PWM signals generated by the at least two generating units driving switching elements so as to control voltage conversion circuits to convert a voltage to a target voltage; and
a control unit configured to set the setting values in the at least two generating units so that a sum of (m ×n) setting values for n periods of the PWM signals approximates a value that is obtained by multiplying the target value by n, wherein m is a number of the at least two generating units and n is a natural number equal to or greater than 2, and wherein the target value is a predetermined value stored on a storage unit;
wherein the control unit includes:
a specifying unit configured to specify a settable value that is closest or second closest to the value that is obtained by multiplying the target value by n, at every n periods of the PWM signals, and
the control unit divides the closest or second closest settable value that was specified by the specifying unit into the setting values for n periods that are to be set in the m generating units, and sets these setting values.

2. The signal generating circuit according to claim 1,
wherein the control unit further includes:
a calculation unit configured to divide the settable value specified by the specifying unit by a product of m and n to obtain a quotient and a remainder; and
a determination unit configured to determine, based on the quotient and the remainder that are obtained by the calculation unit, (m ×n) settable values for n periods that are to be set in the generating units.

3. The signal generating circuit according to claim 1, further comprising:
a storage unit in which (m ×n) settable values for n periods are stored in advance in association with target values,
wherein the control unit is configured to read (m ×n) settable values for n periods that correspond to the target value from the storage unit, and sets the read settable values in the generating units.

4. A voltage conversion device comprising:
the signal generating circuit according to claim 1;
voltage conversion circuits configured to convert a voltage using switching based on duty cycles of signals generated by the signal generating circuit, and
a detection unit configured to detect the voltage converted by the voltage conversion circuits,
wherein the control unit provided in the signal generating circuit includes a second calculation unit configured to calculate the target value based on the voltage detected by the detection unit.

5. The signal generating circuit according to claim 2,
wherein the determination unit is configured to determine the (m ×n) settable values for n periods, by specifying the quotient as a reference value for the (m ×n) settable values for n periods, splitting the remainder into minimum increments of the settable values, and adding the minimum increments to at least one of the (m ×n) reference values for n periods.

6. A voltage conversion device comprising:
the signal generating circuit according to claim 2;
voltage conversion circuits configured to convert a voltage using switching based on duty cycles of signals generated by the signal generating circuit, and
a detection unit configured to detect the voltage converted by the voltage conversion circuits,
wherein the control unit provided in the signal generating circuit includes a second calculation unit configured to calculate the target value based on the voltage detected by the detection unit.

7. A voltage conversion device comprising:
the signal generating circuit according to claim 3;
voltage conversion circuits configured to convert a voltage using switching based on duty cycles of signals generated by the signal generating circuit, and
a detection unit configured to detect the voltage converted by the voltage conversion circuits,
wherein the control unit provided in the signal generating circuit includes a second calculation unit configured to calculate the target value based on the voltage detected by the detection unit.

8. A voltage conversion device comprising:
the signal generating circuit according to claim 5;
voltage conversion circuits configured to convert a voltage using switching based on duty cycles of signals generated by the signal generating circuit, and
a detection unit configured to detect the voltage converted by the voltage conversion circuits,
wherein the control unit provided in the signal generating circuit includes a second calculation unit configured to calculate the target value based on the voltage detected by the detection unit.

9. A signal generating method in which a signal generating circuit generates PWM signals, the signal generating circuit including m generating units each configured to generate, as a result of a setting value from a plurality of settable values being set in accordance with a target value, a PWM signal that corresponds to the setting value, the PWM signals generated by the m generating units driving switching elements so as to control voltage conversion circuits to convert a voltage to a target voltage, the method comprising:
specifying a settable value that is closest or second closest to a value that is obtained by multiplying the target value by n, at every n periods (where n is a natural number equal to or greater than 2) of the PWM signals; and
dividing the specified closest or second closest settable value into the setting values for n periods that are to be set in the m generating units, and setting these setting values.

* * * * *